United States Patent [19]

Goldberg et al.

[11] Patent Number: 4,845,337
[45] Date of Patent: Jul. 4, 1989

[54] OVENIZED OSCILLATOR ASSEMBLY

[75] Inventors: Seymour Goldberg, Saugus; Thomas J. Lynch, Peabody, both of Mass.

[73] Assignee: EG&G, Inc., Wellesley, Mass.

[21] Appl. No.: 151,463

[22] Filed: Feb. 2, 1988

[51] Int. Cl.⁴ .................. H05B 3/62; H01L 41/08; H02N 2/00

[52] U.S. Cl. ................. 219/210; 219/385; 310/343

[58] Field of Search ............. 219/209, 210, 385, 386; 310/341, 343, 344; 330/266, 272, 289

[56] References Cited

U.S. PATENT DOCUMENTS

| | | | |
|---|---|---|---|
| 1,967,185 | 7/1934 | Clapp | 219/210 |
| 2,050,633 | 8/1936 | Stallard | 219/209 |
| 3,320,407 | 5/1967 | Holmes | 219/210 |
| 3,668,527 | 6/1972 | Easton | 219/210 |
| 4,020,368 | 4/1977 | Carney | 310/306 |
| 4,216,371 | 8/1980 | Marotel | 219/210 |
| 4,703,234 | 10/1987 | Kato | 174/13 |
| 4,755,706 | 7/1988 | Harnden | 310/330 |

FOREIGN PATENT DOCUMENTS 904770 11/1945 France .................. 219/210

OTHER PUBLICATIONS

"Precision Crystals and Oscillators", EG&G Cinox, Apr. 9, 1986.
"Manufacturing Methods and Technology . . . ", Allied Bendix Aerospace, date unknown.

Primary Examiner—Teresa J. Walberg
Attorney, Agent, or Firm—Finnegan, Henderson, Farabow, Garrett & Dunner

[57] ABSTRACT

An ovenized oscillator having a temperature sensitive section of an oscillator and a heater supported in a chamber within an enclosure having an insulating gas surrounding the oscillator section and heater. Insulating walls may be added within the chamber to reduce convective heat loss through the gas. These walls form cavities around the oscillator section and are separated from each other except for small vent holes to equilibrate the pressure between cavities.

12 Claims, 3 Drawing Sheets

OVENIZED OSCILLATOR ASSEMBLY

BACKGROUND OF THE INVENTION

This invention relates to an oscillator assembly for providing a constant frequency output over a range of temperatures.

Oscillators, specifically piezoelectric oscillators, have sections which are temperature sensitive. Such oscillators exhibit a variation in the output frequency when the temperature in which the temperature sensitive sections operate varies. For many environments, such as in military applications or scientific instrumentation, a very precise frequency is required over a range of temperatures. The variation in frequency output with temperature is called the oscillator's temperature characteristic.

One way to compensate for variations in frequency output for given differences in temperature is to provide a compensating circuit. Compensating circuits provide feedback to the oscillator during operation. The feedback varies in proportion to the temperature of the surrounding environment. Compensating circuits typically comprise a thermistor-resistor network driving a varactor diode in series with the oscillator. This thermistor-resistor network generates a voltage which varies as a function of temperature. This voltage, when applied to the varactor diode, shifts the output frequency of the oscillator. If the elements of the thermistor-resistor network are chosen properly, the output shift caused by the varactor diode will approximately cancel the oscillator's frequency variation over a range of temperatures.

However, the attempted compensation described above is never perfect. It is typical for there to be a frequency error which limits the accuracy of the oscillator at certain temperatures. When an oscillator is required to operate in an environment having large temperature variations, a compensated oscillator as described above may be unsatisfactory.

An alternative to this approach of compensating for the temperature effects with a compensating circuit is to maintain the temperature of the temperature sensitive section of an oscillator at a constant temperature. In order to maintain the temperature of an oscillator's temperature sensitive section at a constant temperature, temperature sensitive section is preferably maintained in an oven at a temperature above any temperature possible in the operating environment. In this way, a very accurate error-free frequency is produced for a wide range of environmental conditions. However, the power consumption of the resultant oscillator assembly is a critical factor. It is desirable to minimize power consumption. To maintain a high constant oscillator section temperature, a large amount of power is consumed by the oscillator assembly.

The oven temperature should be set to a value comfortably above the highest ambient temperature the oscillator is expected to encounter. For military applications a high ambient temperature of up to 85° C. is common and the oscillator circuit temperature is regulated to be about 100° C. On the other hand, a low limit on ambient temperature for military service is about −55° C. and the amount of power needed to maintain the oven at 100° C. with a −55° C. ambient temperature is often too high to allow use of an oven in portable battery powered applications.

In order to minimize the power consumption it is essential to insulate the temperature sensitive oscillator section from excessive heat loss. Solutions which have been suggested for insulating the temperature sensitive oscillator section are enclosing the oscillator section in a dewary-type flask, enclosing the oscillator section in a vacuum envelope and use of plastic foams surrounding the temperature sensitive oscillator section.

A dewar-type flask has a double wall construction wherein the space between the walls is evacuated. Dewar-type flasks having low loss have to be made of very thin glass and are thus often too fragile for rugged use. In addition, thermal losses through the open end of the dewar-type flask tend to be large.

A vacuum envelope completely surrounding the temperature sensitive oscillator section minimizes thermal conduction and convection losses. This is a costly technique, however, since high vacuum technology must be employed. Anything that would permit or cause the gas pressure in the envelope to rise above $10^{-4}$ torr would quickly destroy the insulating properties of the vacuum envelope. Thus, materials chosen for the oscillator assembly must be of low vapor pressure and outgassed. Outgassing refers to the property of materials to give off various gases over the life of the material. To outgas a material, it is necessary to try to force as much of the gas as possible out of the material before using the material. There are also other manufacturing and assembly problems, such as the very stringent requirements of leak rate into the vacuum.

Plastic foam insulation is a low cost technique but does not provide sufficient insulation to reduce the required power to levels now desired and is subject to aging effects as gas seeps in or out of the foam.

SUMMARY OF THE INVENTION

A principal object of the present invention is to provide a low-powered oscillator assembly having a highly accurate output over a wide variety of environmental temperatures.

Additional objects and advantages of the invention will be set forth in part in the description which follows, and in part will be obvious from the description, or may be learned by practice of the invention.

To achieve the objects and in accordance with the purpose of the invention as embodied and broadly described herein, the ovenized oscillator assembly of this invention comprises a housing having a chamber, an oscillator having a temperature sensitive section supported inside the chamber, heat producing means for maintaining at least the temperature sensitive section of the oscillator at a constant temperature, and insulating means, located sensitive section of the oscillator, the insulating means comprising an insulating gas surrounding at least the temperature sensitive section of the oscillator and having a lower thermal conductivity than air.

The accompanying drawings, which are incorporated in and constitute a part of this specification, illustrate one embodiment of the invention and, together with the description, serve to explain the principles of the invention.

DETAILED DESCRIPTION OF THE PREFERRED EMBODIMENT

Reference will now be made in detail to the present preferred embodiment of the invention, an example of which is illustrated in the accompanying drawings.

Figure 1:
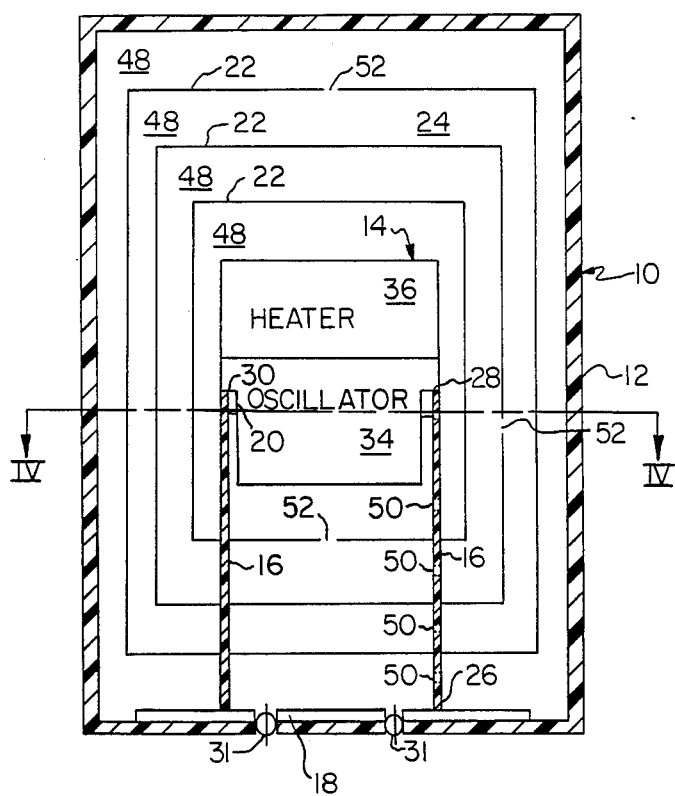
FIG. 1 is a diagrammatical view of a vertical cross-sectional view of an ovenized oscillator assembly which incorporates the teachings of the present invention.

In FIG. 1 there is illustrated an ovenized oscillator assembly 10 which comprises housing 12, electronic assembly 14, support 16, mounting plate 18, mounting ring 20, insulated electrical feed-throughs 31 and walls 22.

Housing 12 preferably comprises a plurality of walls which are sealed one to the other to define, inside housing 12, a chamber 24. This sealing is sufficient to prevent gas in chamber 24 from escaping to the outside of housing 12, but this sealing need not be of a high vacuum variety as will be explained in more detail below. The walls comprising housing 12 are preferably constructed of metal as is well known to those skilled in the art.

Mounting plate 18 is located on an interior surface of a wall of housing 12. Support 16 is preferably cylindrical in cross section, and is connected at a first end 26 to mounting plate 18. Mounting ring 20 is shown in FIG. 1 connected at a second end 28 of support 16 to the interior surface of cylindrical support 16. Electronic assembly 14 is dimensioned to have a shoulder 30 which mates with second end 28 of support 16 and mounting ring 20 to hold electronic assembly 14 in approximately the center of chamber 24. Support 16 is preferably constructed of non-thermally conductive material, such as 0.007 inch thick glass epoxy (G-10 or G-11), so as to minimize any conductive heat loss from electronic assembly 14 to the exterior of housing 12.

Figure 2:
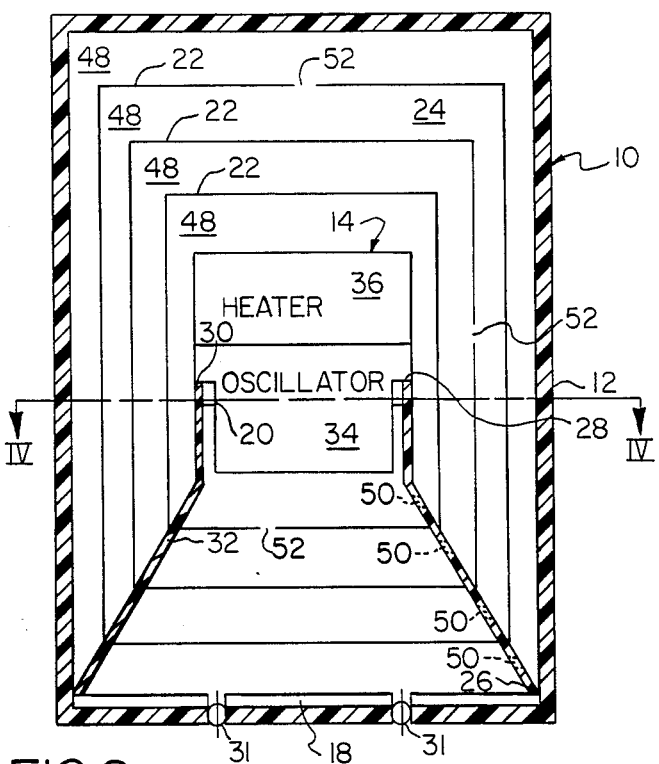
FIG. 2 is a diagrammatical view of a vertical cross-sectional view of an alternate embodiment of an ovenized oscillator assembly which incorporates the teachings of the present invention.

As shown in FIG. 2, in an alternative embodiment, electronic assembly 14 is supported within chamber 24 by a support 32 which is partly conical in shape instead of being entirely cylindrical in shape as is support 16. The shapes of supports 16 and 32 are the only difference between the embodiments of FIG. 1 and FIG. 2. These supports 16, 32 may be made of perforated material or may be made of solid material with four solid support holes 50 added to reduce thermal conduction through the interior of supports 16 and 32. If perforated, some of these holes should then be covered to prevent convection. The inner and outer surfaces of supports 16 and 32 are preferably covered with a low emissivity material such as superinsulation, i.e., ¼ mil. thick polyester film with a low emissivity aluminum deposit on one side. Bonding may be achieved with dots of epoxy, with the aluminum surfaces exposed.

Insulated electrical feedthroughs 31 are sealed to housing 12 walls and are connected with low thermal conductivity and low radiation loss leads, such as 0.005 inch diameter constantan, to electronic assembly 14 in a manner well known to those skilled in the art. These wires may be passed through small holes (not shown) in support 16 and walls 22 to reach electronic assembly 14.

Figure 3:
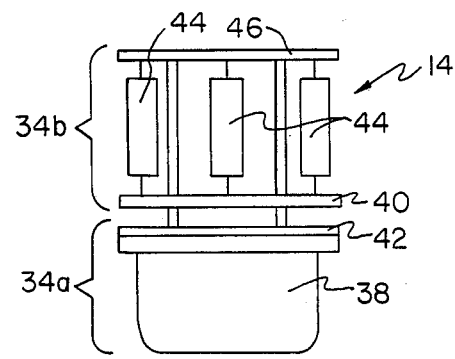
FIG. 3 is a side view of a typical oscillator and heater combination for use in the oscillator assemblies of FIGS. 1 and 2.

As is diagrammatically illustrated in FIGS. 1 and 2, electronic assembly 14 includes an oscillator 34 and a heater 36. As is further illustrated in FIG. 3, oscillator 34 may comprise two sections 34a and 34b. Section 34a is a temperture sensitive section of oscillator 34 which includes a piezoelectric crystal 38 or other resonant devices such as a cavity or LC resonant circuit. Section 34b of oscillator 34 is illustrated in FIG. 3 as including printed circuit boards 40 and 46 and coils or other electronic components 44 such as capacitors, coils, resistors, transistors and diodes connected to circuit boards 40 and 46 for driving piezoelectric crystal 38. Section 34b may not be as temperature sensitive as section 34a.

The components of sections 34a and 34b of oscillator 34 comprise a standard oscillator and may be made of conventional circuit elements as is well known to those skilled in the art.

Heater 36 of FIGS. 1 and 2 is also illustrated in FIG. 3 as comprising a ceramic heating element 42 and temperature control circuits (not shown). In the preferred embodiment the temperature control circuits are located on circuit boards 40 and 46. These temperature control circuits can, however, be located remote from oscillator 34, such as on base plate 18 of FIGS. 1 and 2. Ceramic heating element 42 is shown physically coupled to crystal 38. Ceramic heating element 42 preferably comprises a disc of ceramic material with a heater transistor (not shown) bonded to or embedded therein. Current running through this heater transistor generates heat to maintain a constant temperture within chamber 24 of housing 12. Thus, ceramic heating element 42 and the temperature control circuits operate to maintain temperature sensitive section 34a of oscillator 34 at a constant temperature in a conventional manner.

It is also preferable to maintain the driving circuits of oscillator section 34b at a constant temperature since temperature effects on these driving circuits will also affect the oscillator frequency. Thus in a preferred embodiment as illustrated in FIG. 3 the temperature of oscillator section 34b is also maintained constant through operation of ceramic heating element 42. However, it should be understood that there may be sections of oscillator 34 which are not heat sensitive and, accordingly, need not be maintained at a constant temperature through operation of heating element 42. These non-temperature sensitive sections of oscillator 34 may also be mounted remote from ceramic heating element 42 such as on base plate 18 or outside of chamber 24.

In accordance with the teachings of the present invention, insulating means are provided inside a chamber of an ovenized oscillator assembly for retarding heat loss from a temperature sensitive section of an oscillator within that assembly, the insulating means comprising an insulating gas surrounding the temperature sensitive section of the oscillator and having a lower thermal conductivity than air. In the preferred embodiments of FIGS. 1 and 2, xenon gas is contained within chamber 24 of housing 12. Xenon gas is thus made to surround oscillator 34, including temperature sensitive sections 34a and 34b in a preferred embodiment. Xenon gas has a lower thermal conductivity than air. In alternative embodiments, the xenon gas may be replaced with a suitable alternative insulating gas such as krypton, sulphur hexafluoride or a freon gas. These gases are all relatively inert gases which may be used in the illustrated preferred embodiments of FIGS. 1 and 2 to minimize conduction heat loss from temperature sensitive oscillator sections 34a and 34b to outside chamber 24 of housing 12.

The pressure of the xenon insulating gas or any alternative gas used in place of xenon should be above the gas pressure resulting from outgassing or from other virtual leaks. The thermal conductivity of the insulating gas employed is largely independent of the pressure of that gas, provided the pressure exceeds a fraction of a torr. Thus, the necessary pressure inside chamber 24 of housing 12 may be maintained at a level substantially greater than that which would be required if a high vacuum were necessary to be present inside chamber 24. The less stringent resultant sealing requirements for chamber 24 reduce production costs of the ovenized oscillator assembly 10. In addition, the cost of high vacuum processing is avoided.

The insulating gas described above as being present inside chamber 24 reduces conductive heat loss from oscillator sections 34a and 34b. Nevertheless, the presence of this gas could result in convection heat losses due to the movement of this gas when heated. Accordingly, the insulating means of the present invention further preferably includes a plurality of walls arranged inside the chamber to retard movement of the gas inside the chamber and thereby retard convection heat loss from the oscillator.

Figure 4:
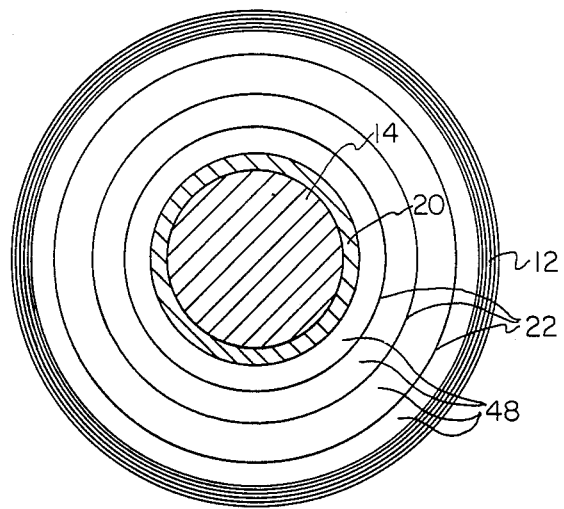
FIG. 4 is a horizontal cross-sectional view taken along line IV—IV of FIGS. 1 and 2.

In the illustrated preferred embodiments of FIGS. 1, 2 and 4, housing 12 further includes a plurality of spaced walls 22 which form therebetween a plurality of subcavities 48. Walls 22 preferably are constructed from a plastic material such as 0.007 inch thick glass epoxy (G-10 or G-11). Walls 22 preferably are located along isothermal regions of chamber 24 to prevent conduction of heat along or through walls 22. That is, as illustrated in FIG. 4, walls 22 are located at equal distances from the assembly 14 which forms cylindrical shells in the preferred embodiment. The cylindrical shape of walls 22 is pieced together from glass epoxy sheets with epoxy resin binding the glass epoxy pieces to themselves and supports 16 and 32 to form the cylindrical shell shape in a well known manner. It is also preferable, to further minimize radiation heat loss, that the surfaces of walls 22 be coated with a low emissivity coating, such as a ¼ mil thick aluminized polyester film similar to that described for supports 16, 32.

As is further illustrated in FIGS. 1 and 2, a plurality of small holes 50 are provided in supports 16 and 32 to prevent conduction and vent holes 52 are provided in walls 22 in order to permit the pressure within subcavities 48 to equalize.

It will be apparent to those skilled in the art that various modifications and variations may be made in the disclosed preferred embodiments without departing from the scope or spirit of the invention. As an example, in order to reduce convection heat loss, walls 22 may be replaced by fibrous and microporous materials which have a structure that allows introduction of a low thermal conductivity gas, but restricts convection currents. Another technique for reducing convection losses without the use of a plurality of walls 22 is to reduce the gas pressure. Pressure below about 200 torr significantly minimizes convection losses, but is still high enough to avoid high vacuum problems. In some cases, however, a fill pressure of 1 atmosphere (760 torr) is more desirable to minimize leakage of external air into the housing in the event of any small leaks. Thus, it is intended that the present invention cover the modifications and variations of this invention, provided they come within the scope of the appended claims and their legally permissive equivalents.

What is claimed is:

1. An ovenized oscillator assembly, comprising:
   a housing having a chamber;
   an oscillator having a temperature sensitive section supported inside said chamber;
   heat producing means for maintaining at least said temperature sensitive section of said oscillator at a constant temperature and;
   insulating means, located inside said chamber, for retarding heat loss from said temperature sensitive section of said oscillator, said insulating means comprising an insulating gas surrounding at least said temperature sensitive section of said oscillator and having a lower thermal conductivity than air.

2. An ovenized osciallator according to claim 1, wherein said insulating means further includes a plurality of walls arranged inside said chamber to retard movement of said gas inside said chamber and thereby retard convection heat loss from at least said temperature sensitive section of said oscillator.

3. An ovenized oscillator according to claim 2, wherein said walls are spaced to form subcavities surrounding said temperature sensitive section of said oscillator.

4. An ovenized oscillator according to claim 3, wherein said walls include vent holes to allow equalization of pressure between said subcavities.

5. An ovenized oscillator according to claim 4, wherein said walls are located along isothermal regions of said chamber.

6. An ovenized oscillator according to claim 5, wherein said plurality of walls comprise plastic coated with a low emissivity material on at least one surface of said walls.

7. An ovenized oscillator according to claim 1, wherein said oscillator includes a piezoelectric crystal.

8. An ovenized oscillator according to claim 7, wherein said heat producing means comprises a ceramic heating element located adjacent to said temperature sensitive section of said oscillator.

9. An ovenized oscillator according to claim 1, wherein said insulating gas is xenon.

10. An ovenized oscillator according to claim 1, wherein said insulating gas is krypton.

11. An ovenized oscillator according to claim 1, wherein said insulating gas is sulphur hexafluoride.

12. An ovenized oscillator according to claim 1, wherein said insulating gas is chosen from the group consisting of freon gasses.

* * * * *